United States Patent
Kobayashi

(10) Patent No.: US 8,384,273 B2
(45) Date of Patent: Feb. 26, 2013

(54) PIEZOELECTRIC VIBRATING REED, PIEZOELECTRIC VIBRATOR, OSCILLATOR, ELECTRONIC DEVICE, RADIO-CONTROLLED CLOCK, AND METHOD FOR MANUFACTURING PIEZOELECTRIC VIBRATING REED

(75) Inventor: Takashi Kobayashi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 13/323,021

(22) Filed: Dec. 12, 2011

(65) Prior Publication Data
US 2012/0126908 A1 May 24, 2012

Related U.S. Application Data

(62) Division of application No. 12/839,955, filed on Jul. 20, 2010, now Pat. No. 8,097,177.

(30) Foreign Application Priority Data

Jul. 21, 2009 (JP) .................................. 2009-170382

(51) Int. Cl.
*H03H 9/17* (2006.01)
*H01L 41/053* (2006.01)
*H01P 1/18* (2006.01)

(52) U.S. Cl. ......... 310/370; 310/348; 310/367; 333/156
(58) Field of Classification Search .................. 310/348, 310/367, 370; 331/156, 158
See application file for complete search history.

(56) References Cited

U.S. PATENT DOCUMENTS

| | | |
|---|---|---|
| 2007/0222342 A1 | 9/2007 | Hokibara et al. |
| 2008/0209703 A1 | 9/2008 | Iwai |
| 2009/0289531 A1 | 11/2009 | Fang et al. |
| 2011/0115342 A1 | 5/2011 | Yang et al. |

FOREIGN PATENT DOCUMENTS

JP 2007-274610 A 10/2007

*Primary Examiner* — Thomas Dougherty
(74) *Attorney, Agent, or Firm* — Brinks Hofer Gilson & Lione

(57) ABSTRACT

This invention is provided a piezoelectric vibrating reed which is capable of decreasing variation in the amount of etching reside as much as possible and suppressing influence of vibration loss on the vibration characteristics as much as possible. A piezoelectric vibrating reed comprising a vibrating section extensive in parallel in a longitudinal direction and a base to which the vibrating section is connected at this proximal end. The base comprises at least a first section and a second section defined from the side of the proximal end of the base long the longitudinal direction. The first section is wider in a transverse direction than the second section.

10 Claims, 15 Drawing Sheets

PIEZOELECTRIC VIBRATING REED, PIEZOELECTRIC VIBRATOR, OSCILLATOR, ELECTRONIC DEVICE, RADIO-CONTROLLED CLOCK, AND METHOD FOR MANUFACTURING PIEZOELECTRIC VIBRATING REED

RELATED APPLICATION

This application is a divisional application of U.S. patent application Ser. No. 12/839,955 filed on Jul. 20, 2010 now U.S. Pat. No. 8,097,177 which claims priority under 35 U.S.C. §119 to Japanese Patent Application No. 2009-170382 filed on Jul. 21, 2009, the entire content of which is hereby incorporated by reference.

BACKGROUND OF THE INVENTION

1. Field of the Invention

The present invention relates to a piezoelectric vibrating reed made of a piezoelectric material, such as quartz or lithium tantalate, a piezoelectric vibrator having the piezoelectric vibrating reed, and an oscillator, an electronic device, and a radio-controlled clock each having the piezoelectric vibrator, as well as a manufacturing method of the piezoelectric vibrating reed.

2. Description of the Related Art

Recently, a piezoelectric vibrator utilizing quartz or the like is used in a cellular phone and a portable information terminal as the time source, the timing source of a control signal, a reference signal source, and the like. The piezoelectric vibrator of this type is proposed in a variety of forms, and a piezoelectric vibrator having a turning-fork type piezoelectric vibrating reed is one example. This piezoelectric vibrating reed is a vibrating reed that allows a pair of vibrating arms disposed in parallel to each other to vibrate at a predetermined resonance frequency in a direction to move closer to or away from each other.

As represented by cellular phones, various electronic devices having the piezoelectric vibrator have become smaller in recent years. Accordingly, there is a demand for the piezoelectric vibrating reed of the piezoelectric vibrator to be further reduced in size. Therefore, the piezoelectric vibrating reed is expected to have a structure such that the length of the vibrating arm or base portion thereof is decreased so as to have a shorter total length.

Among this, since the length and width of the vibrating arm are proportional to the frequency of the piezoelectric vibrating reed, it is necessary to decrease the width when the length of the vibrating arm is decreased. However, when the width of the vibrating arm is decreased, there is a problem in that the CI value (crystal impedance) also increases. Therefore, it is difficult to decrease the length of the vibrating arm while maintaining a low CI value.

Therefore, in order to achieve miniaturization of the piezoelectric vibrating reed, it is effective to decrease the length of the base portion. However, since mounting of the piezoelectric vibrating reed is achieved via the base portion, mounting performance thereof will decrease if the length of the base portion is decreased. Therefore, the length of the base portion is typically designed to be as small as possible to an extent that a predetermined mounting performance is secured.

However, it is known that vibration loss (leakage of vibration energy) through the base portion occurs when the piezoelectric vibrating reed is operated. Since this vibration loss leads to an increase of the CI value, it is necessary to suppress the vibration loss as much as possible. In this respect, the vibration loss can be effectively suppressed since the vibration of the vibrating arm can be stabilized by increasing the length of the base portion as much as possible. However, as described above, the length of the base portion is designed to be as small as possible to an extent that predetermined mounting performance is secured from the perspective of miniaturization. Therefore, there is a need to be able to suppress the vibration loss without changing the designed length.

Under such a circumstance, as an effective countermeasure to the vibration loss, as shown in FIG. 19, JP-A-2007-274610 discloses a method of forming a notch portion 202 on either side of a base portion 201.

In this piezoelectric vibrating reed 200, the base portion 201 is divided into an intermediate portion 201*a* and a mounting portion 201*b*, which have a different horizontal width, by the presence of the notch portion 202. The mounting portion 201*b* has a greater horizontal width than the intermediate portion 201*a* and is a portion which is mainly used when the piezoelectric vibrating reed 200 is mounted. On the other hand, the intermediate portion 201*a* has a smaller horizontal width than the mounting portion 201*b* and is a portion which is positioned between the mounting portion 201*b* and the vibrating arm 203 and to which the base end of the vibrating arm 203 is fixed.

In this way, since by forming the notch portion 202, the mounting portion 201*b* having a large width can be disposed to be continuous to the intermediate portion 201*a*, it is possible to effectively suppress the vibration loss. In particular, the length L of the intermediate portion 201*a* is important, and the vibration loss can be effectively suppressed when the length L is optimum. Therefore, the formation position of the notch portion 202 is designed accurately so that the length L of the intermediate portion 201*a* becomes optimum.

When the outer shape of the piezoelectric vibrating reed 200 is formed, a protection mask such as a metal mask is generally formed on a quartz wafer, and the protection mask is then patterned so as to comply with the outer shape of the piezoelectric vibrating reed 200. Subsequently, the quartz wafer is etched using the patterned protection mask as a mask, thus obtaining a desired outer shape.

However, there is a case where during the etching, an etching residue 205 as shown in FIGS. 20 and 21 is formed in a step portion between the intermediate portion 201*a* and the mounting portion 201*b*. Formation of this etching residue 205 results mainly from the fact that the notch portion 202 is formed in a direction opposite to the crystal direction of the quartz wafer. The shorter the etching time, more of the etching residue 205 remains as shown in FIG. 20. The longer the etching time, less of the etching residue 205 remains as shown in FIG. 21.

When the etching residue 205 is formed, the length of the intermediate portion 201*a* will change. That is to say, the length (effective value) of the intermediate portion 201*a* will be L1 for the short etching time as shown in FIG. 20 and L2 for the long etching time as shown in FIG. 21. Particularly, since the amount of the etching residue 205 is likely to vary depending on the etching time, the variation thereof will be great and it is thus difficult to adjust the length of the intermediate portion 201*a* to a uniform length every time.

Therefore, there is a problem in that the vibration loss also varies and it is unable to stabilize the influence of the vibration loss on the vibration characteristics.

SUMMARY OF THE INVENTION

The present invention has been made in view of the foregoing, and an object of the present invention is to provide a high-quality piezoelectric vibrating reed which is capable of decreasing variation in the amount of etching residue as much as possible and suppressing influence of vibration loss on the vibration characteristics as much as possible.

Another object of the present invention is to provide a method for manufacturing the piezoelectric vibrating reed, a piezoelectric vibrator having the piezoelectric vibrating reed, and an oscillator, an electronic device, and a radio-controlled clock each having the piezoelectric vibrator.

The present invention provides the following means in order to solve the problems.

According to an aspect of the present invention, there is provided a piezoelectric vibrating reed including: a piezoelectric plate which includes a vibrating part formed so as to extend along a central axis and a base portion that supports a base end of the vibrating part; excitation electrodes which are formed on an outer surface of the vibrating part and allow the vibrating part to vibrate when a voltage is applied thereto, wherein the base portion includes: a mounting portion in which mount electrodes are formed on an outer surface thereof; an intermediate portion which is disposed continuously between the mounting portion and the vibrating part and in which an extraction electrode connecting the excitation electrodes and the mount electrodes together is formed on an outer surface thereof, wherein the mounting portion has a greater horizontal width than the intermediate portion, and wherein a side surface of the mounting portion and a side surface of the intermediate portion are continuous to each other at a step portion between the mounting portion and the intermediate portion via a sloped surface that is sloped relative to the central axis in a top view thereof.

According to another aspect of the present invention, there is provided a method for manufacturing a plurality of the piezoelectric vibrating reeds at a time using a wafer made of a piezoelectric material, the method including: an outer shape forming step of masking the wafer with a protection mask and then etching out unmasked portions to form the outer shape of a plurality of piezoelectric plates each including the vibrating part and the base portion; an electrode forming step of patterning an electrode film on the outer surfaces of the plurality of piezoelectric plates to form the mount electrodes and the extraction electrodes; and a cutting step of separating the plurality of piezoelectric plates from the wafer to obtain small fragments, wherein, during the outer shape forming step, one whose outer shape is preformed so as to comply with the outer shape of the base portion where the mounting portion and the intermediate portion are continuous to each other via the sloped surface is used as the protection mask.

In the piezoelectric vibrating reed and the manufacturing method of the piezoelectric vibrating reed according to the aspects of the present invention, the outer shape forming step is performed where a wafer made of a piezoelectric material such as quartz is masked with a protection mask, and unmasked portions are etched out to form the outer shape of a plurality of piezoelectric plates on the wafer. At this time, the outer shape is formed such that each piezoelectric plate includes a base portion and a vibrating part.

Subsequently, the electrode forming step is performed where an electrode film is patterned on the outer surfaces of the plurality of piezoelectric plates to form excitation electrodes, mount electrodes, and lead-out electrodes. Thereafter, the cutting step is performed where the plurality of piezoelectric plates are separated from the wafer to obtain small fragments. In this way, a plurality of piezoelectric vibrating reeds can be manufactured from one wafer at a time.

During the outer shape forming step, a protection mask is used whose outer shape is preformed so as to comply with the outer shape of a base portion in which a sloped surface is formed in a step portion between a mounting portion and an intermediate portion, and a side surface of the mounting portion and a side surface of the intermediate portion are made continuous to each other by the sloped surface. Therefore, by etching the wafer using the protection mask, it is possible to obtain a base portion in which the side surface of the mounting portion and the side surface of the intermediate portion are made continuous to each other by the sloped surface, and the horizontal width of the mounting portion is greater than the horizontal width of the intermediate portion.

Particularly, unlike a piezoelectric vibrating reed of the related art in which a notch portion is formed in a direction opposite to the crystal direction of the wafer, since the side surface of the mounting portion and the side surface of the intermediate portion are continuous to each other at a step portion between the mounting portion and the intermediate portion by the sloped surface which can be easily formed along the crystal direction of the wafer, the formation state of the sloped surface will rarely change depending on a change in the etching time. That is to say, the slope angle of the sloped surface will rarely change even when the etching time is increased or decreased. Therefore, it is possible to decrease the variation in the amount of etching residue as much as possible and to adjust the length of the intermediate portion to a uniform length every time, the length which is ideal for a countermeasure against vibration loss. Accordingly, it is possible to suppress the influence of the vibration loss on the vibration characteristics and to thus obtain a high-quality piezoelectric vibrating reed.

In the piezoelectric vibrating reed according to the above aspect of the present invention, an angle between the side surface of the mounting portion and the sloped surface may be in the range of 30° and 60°.

In the manufacturing method of the piezoelectric vibrating reed according to the above aspect of the present invention, the outer shape of the protection mask may be formed so that an angle between the side surface of the mounting portion and the sloped surface is in the range of 30° and 60°.

In the piezoelectric vibrating reed and the manufacturing method of the piezoelectric vibrating reed according to the aspects of the present invention, since the angle between the side surface of the mounting portion and the sloped surface is in the range of 30° and 60°, it is possible to decrease the variation in the amount of etching residue further even when the etching time changes. Therefore, it is possible to adjust the length of the intermediate portion to a further uniform length and to stabilize the influence of the vibration loss on the vibration characteristics further.

In the piezoelectric vibrating reed according to the above aspect of the present invention, the angle between the side surface of the mounting portion and the sloped surface may be 45°.

In the manufacturing method of the piezoelectric vibrating reed according to the above aspect of the present invention, the outer shape of the protection mask may be formed so that an angle between the side surface of the mounting portion and the sloped surface is 45°.

In the piezoelectric vibrating reed and the manufacturing method of the piezoelectric vibrating reed according to the aspects of the present invention, since the angle between the side surface of the mounting portion and the sloped surface is 45°, it is better able to make the sloped surface identical with the crystal direction of the wafer. Therefore, it is possible to decrease the variation in the amount of etching residue still further even when the etching time changes. Accordingly, it is possible to stabilize the influence of the vibration loss on the vibration characteristics still further. In particular, it is possible to obtain a piezoelectric vibrating reed suitable for a turning-fork type.

In the piezoelectric vibrating reed according to the above aspect of the present invention, the vibrating part may include a pair of vibrating arms which are disposed in parallel to each other to be horizontally symmetrical with respect to the central axis.

In the manufacturing method of the piezoelectric vibrating reed according to the above aspect of the present invention, during the outer shape forming step, the vibrating part may be formed so as to have a pair of vibrating arms which are disposed in parallel to each other to be horizontally symmetrical with respect to the central axis.

In the piezoelectric vibrating reed and the manufacturing method of the piezoelectric vibrating reed according to the aspects of the present invention, it is possible to obtain a turning-fork type piezoelectric vibrating reed in which a pair of vibrating arms are allowed to vibrate in a direction to move closer to or away from each other when a voltage is applied to excitation electrodes. Particularly, since the influence of the vibration loss on the vibration characteristics is very small, it is possible to obtain a high-quality turning-fork type piezoelectric vibrating reed.

According to a further aspect of the present invention, there is provided a piezoelectric vibrator including the piezoelectric vibrating reed according to the above aspect of the present invention.

In the piezoelectric vibrator according to the above aspect of the present invention, since the piezoelectric vibrator includes the high-quality piezoelectric vibrating reed in which the influence of the vibration loss on the vibration characteristics is very small, it is possible to obtain a high-quality piezoelectric vibrator having improved reliability.

In the piezoelectric vibrator according to the above aspect of the present invention, the piezoelectric vibrator may include: a base board mounting the piezoelectric vibrating reed on an upper surface thereof; a lid board bonded to the base board in a state where the mounted piezoelectric vibrating reed is accommodated in a cavity; and a pair of outer electrodes that are formed on a lower surface of the base board and electrically connected to the excitation electrodes of the mounted piezoelectric vibrating reed.

In the piezoelectric vibrator according to the above aspect of the present invention, the piezoelectric vibrating reed is accommodated in a cavity that is formed between the base board and the lid board being bonded to each other. At this time, the piezoelectric vibrating reed is mounted on the upper surface of the base board in a state of being electrically connected to the pair of outer electrodes. With this configuration, since a voltage can be applied to the excitation electrodes by applying a voltage to the pair of outer electrodes, the pair of vibrating arms can be vibrated.

Particularly, since the piezoelectric vibrator can be configured as a packaged piezoelectric vibrator of the surface-mounting type in which the piezoelectric vibrating reed is hermetically sealed in the cavity, it is possible to allow the piezoelectric vibrating reed to vibrate without being affected by dust or the like and achieve highly accurate vibration of the piezoelectric vibrating reed. In addition, since the piezoelectric vibrator is a surface-mounting type piezoelectric vibrator, the piezoelectric vibrator can be mounted easily and has excellent stability after being mounted.

In the piezoelectric vibrator according to the above aspect of the present invention, the piezoelectric vibrator may include: a case that accommodates therein the piezoelectric vibrating reed; and an airtight terminal that hermetically seals the inside of the case, wherein the airtight terminal includes: a stem that is formed in a ring-like shape and press-fit to be fixed to the inside of the case; two lead terminals which are disposed in a state of penetrating through the stem while interposing the stem therebetween, in which one ends thereof serve as inner leads electrically connected to the excitation electrodes, and the other ends thereof serve as outer leads electrically connected to the outside; and a filling member that fixes the lead terminals and the stem.

In the piezoelectric vibrator according to the above aspect of the present invention, the piezoelectric vibrating reed is accommodated in a case that is hermetically sealed by the airtight terminal. At this time, the piezoelectric vibrating reed is mounted by the lead terminals in a state where the excitation electrodes are electrically connected to the inner leads of the two lead terminals. With this configuration, since a voltage can be applied to the excitation electrodes by applying a voltage to the outer leads of the two lead terminals, the vibrating part can be vibrated.

Particularly, since the piezoelectric vibrator can be configured as a cylinder-packaged piezoelectric vibrator in which the piezoelectric vibrating reed is hermetically sealed in the case, it is possible to allow the piezoelectric vibrating reed to vibrate without being affected by dust or the like and achieve highly accurate vibration of the piezoelectric vibrating reed.

According to a still further aspect of the present invention, there is provided an oscillator in which the piezoelectric vibrator according to the above aspect of the present invention is electrically connected to an integrated circuit as an oscillating piece.

According to a still further aspect of the present invention, there is provided an electronic device in which the piezoelectric vibrator according to the above aspect of the present invention is electrically connected to a time counting portion.

According to a still further aspect of the present invention, there is provided a radio-controlled clock in which the piezoelectric vibrator according to the above aspect of the present invention is electrically connected to a filter portion.

In the oscillator, electronic device, and radio-controlled clock according to the above aspect of the present invention, since they have the piezoelectric vibrator described above, it is possible to achieve improvement in reliability and high quality.

According to the piezoelectric vibrating reed and the manufacturing method of the piezoelectric vibrating reed according to the above aspect of the present invention, it is possible to provide a high-quality piezoelectric vibrating reed which is capable of decreasing variation in the amount of etching residue as much as possible and in which the influence of the vibration loss on the vibration characteristics is very small.

According to the piezoelectric vibrator, oscillator, electronic device, and radio-controlled clock according to the above aspect of the present invention, since they have the piezoelectric vibrating reed described above, it is possible to achieve improvement in reliability and high quality.

DETAILED DESCRIPTION OF THE PREFERRED EMBODIMENTS

Piezoelectric Vibrating Reed

Hereinafter, a piezoelectric vibrating reed according to an embodiment of the present invention will be described with reference to FIGS. 1 to 10. The present embodiment will be described by way of an example of a turning-fork type piezoelectric vibrating reed having groove portions as an example of the piezoelectric vibrating reed.

Figure 1:
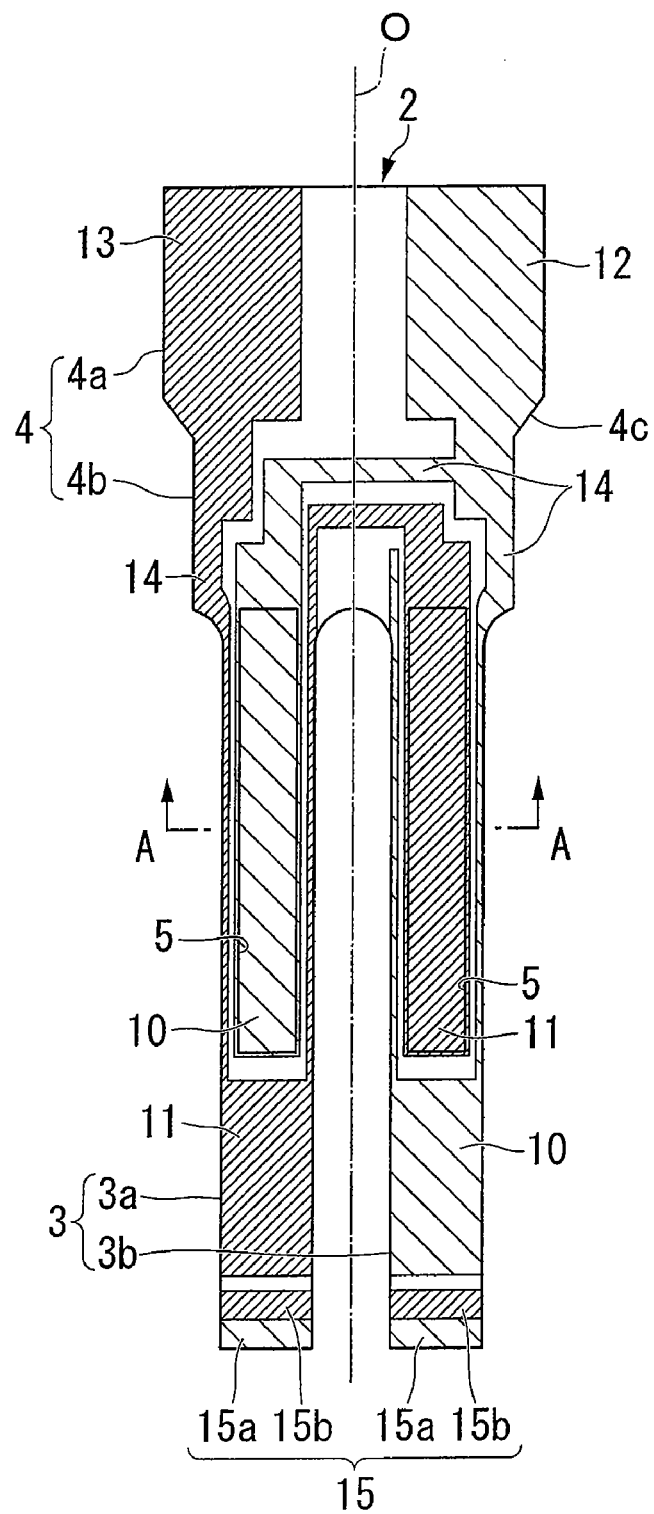
FIG. 1 is a top view showing a piezoelectric vibrating reed according to an embodiment of the present invention.
Figure 2:
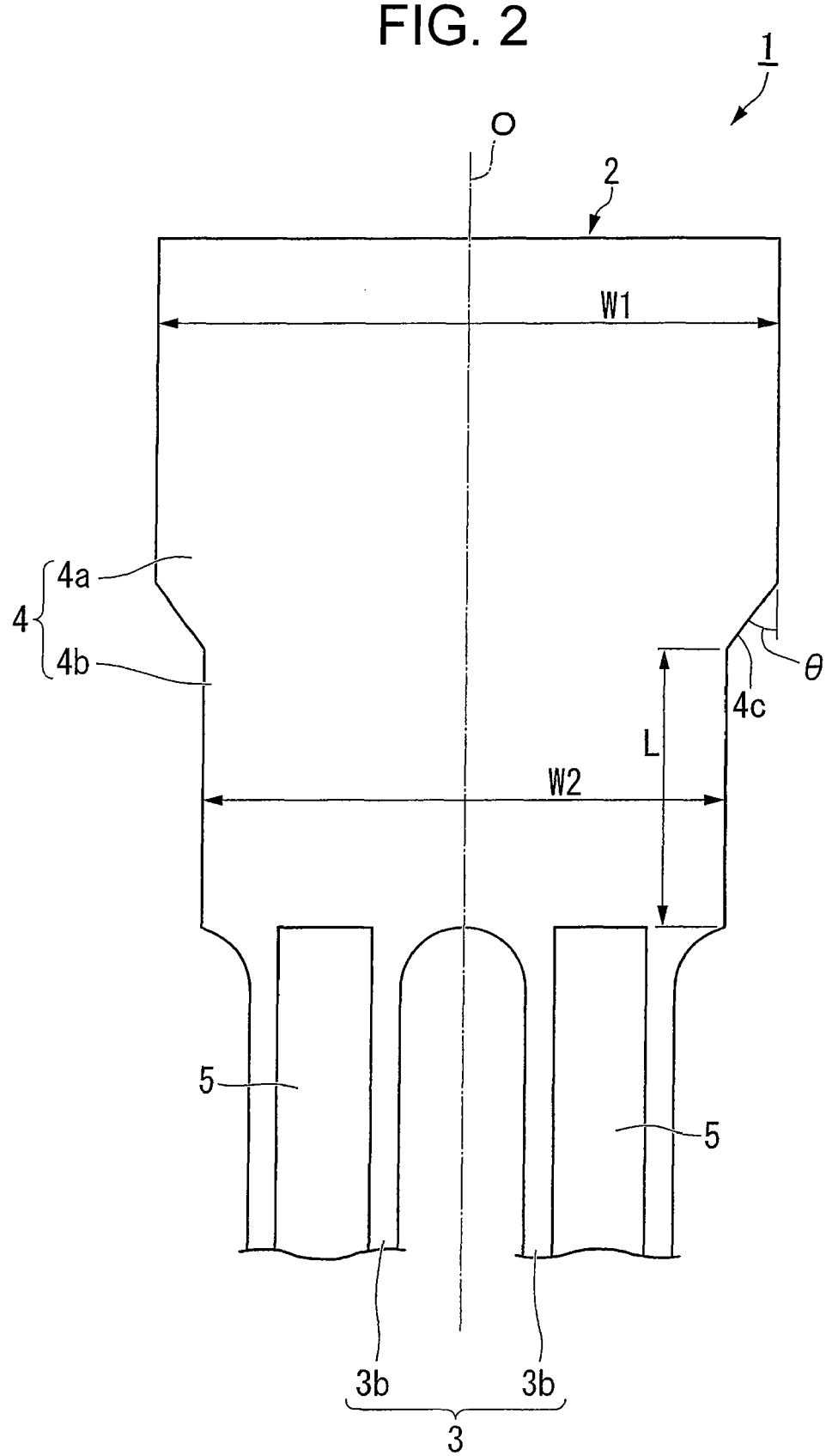
FIG. 2 is an enlarged view of the piezoelectric vibrating reed shown in FIG. 1, showing a base end of a vibrating arm in an enlarged scale.

A piezoelectric vibrating reed 1 according to the present embodiment is incorporated, for example, into a glass-packaged or cylinder-packaged piezoelectric vibrator of the surface-mounting type. As shown in FIGS. 1 and 2, the piezoelectric vibrating reed 1 includes a turning-fork type piezoelectric plate 2 made of a piezoelectric material such as quartz, lithium tantalate, or lithium niobate.

FIG. 1 is a top view of the piezoelectric vibrating reed 1. FIG. 2 is an enlarged view of base ends of vibrating arms 3a and 3b shown in FIG. 1. Respective electrodes are not shown in FIG. 2.

The piezoelectric plate 2 includes a vibrating part 3 that is formed so as to extend along a central axis O and a base portion 4 that supports a base end of the vibrating part 3. The vibrating part 3 includes a pair of vibrating arms 3a and 3b which are disposed in parallel to each other to be horizontally symmetrical with respect to the central axis O.

Figure 3:
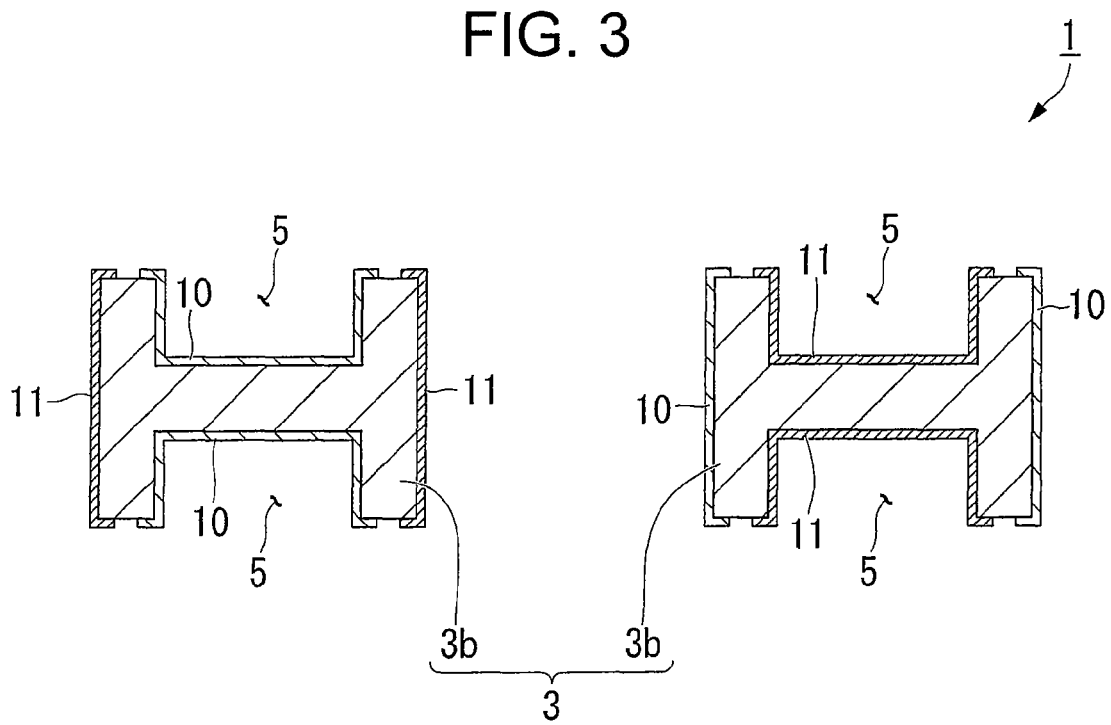
FIG. 3 is a sectional view of the piezoelectric vibrating reed taken along the line A-A in FIG. 1.

Moreover, on the principal surfaces (top and back surfaces) of the pair of vibrating arms 3a and 3b, groove portions 5 are formed so as to extend in a vertical direction with a constant width from the base ends of the vibrating arms 3a and 3b towards the tip ends thereof. The groove portions 5 extend from the base ends of the vibrating arms 3a and 3b to positions over the intermediate portions thereof. With this configuration, the pair of vibrating arms 3a and 3b each have an H-type section as shown in FIG. 3. FIG. 3 is a sectional view taken along the line A-A in FIG. 1.

On the outer surfaces of the piezoelectric plate 2 formed thus, a pair of excitation electrodes 10 and 11 and a pair of mount electrodes 12 and 13 are formed, as shown in FIGS. 1 and 3. Among these electrodes, the pair of excitation electrodes 10 and 11 are electrodes that allow the pair of vibrating arms 3a and 3b to vibrate at a predetermined resonance frequency in a direction to move closer to or away from each other upon application of a voltage. The excitation electrodes 10 and 11 are formed on the outer surfaces of the pair of vibrating arms 3a and 3b in an electrically isolated state.

Specifically, as shown in FIG. 3, one excitation electrode 10 is mainly formed in the groove portion 5 of one vibrating arm 3a and on the side surfaces of the other vibrating arm 3b. On the other hand, the other excitation electrode 11 is mainly formed on the side surfaces of one vibrating arm 3a and in the groove portion 5 of the other vibrating arm 3b.

Moreover, the pair of mount electrodes 12 and 13 are formed on the outer surface including the principal surface and the side surfaces of the base portion 4 and are electrically connected to the pair of excitation electrodes 10 and 11, respectively, via an extraction electrode 14. Therefore, a voltage is applied to the pair of excitation electrodes 10 and 11 via the mount electrodes 12 and 13.

The above-mentioned excitation electrodes 10 and 11, mount electrodes 12 and 13, and extraction electrode 14 are made of a laminated film of chromium (Cr) and gold (Au), for example, which is formed by depositing a chromium film having good adhesion to quartz as a base film and depositing a thin film of gold on the surface of the base film. However, it should be noted that the present invention is not limited to this example, but, for example, a thin film of gold may be laminated further on the surface of a laminated film of chromium and nichrome (NiCr). Moreover, the above-mentioned electrodes may be made of a single-layer film of chromium, nickel, aluminum (Al), or titanium (Ti).

Furthermore, as shown in FIG. 1, formed weight metal films 15 (including a rough tuning film 15a and a fine tuning film 15b) for adjusting the vibration states (specifically, tuning the frequency) of the pair of vibrating arms 3a and 3b to vibrate within a predetermined frequency range are formed on the tip ends of the vibrating arms 3a and 3b. By tuning the frequency with the use of the weight metal films 15, the frequency of the pair of the vibrating arms 3a and 3b can be set to fall within the range of the nominal frequency of the device.

As shown in FIGS. 1 and 2, the base portion 4 of the piezoelectric vibrating reed 1 according to the present embodiment include a mounting portion 4a which is formed on the outer surfaces of the mount electrodes 12 and 13 and an intermediate portion 4b which is disposed continuously between the mounting portion 4a and the vibrating part 3 including the vibrating arms 3a and 3b and in which the extraction electrode 14 is formed on an outer surface thereof.

At this time, as shown in FIG. 2, a horizontal width W1 of the mounting portion 4a is greater than a horizontal width W2 of the intermediate portion 4b. Moreover, a side surface of the mounting portion 4a and a side surface of the intermediate portion 4b are continuous to each other at a step portion between the mounting portion 4a and the intermediate portion 4b via a sloped surface 4c that is sloped relative to the central axis O in a top view thereof.

In the present embodiment, the angle θ between the side surface of the mounting portion 4a and the sloped surface 4c is set to 45° which is within the range of 30° and 60°.

When the piezoelectric vibrating reed 1 configured in this manner is operated, a predetermined drive voltage is applied between the pair of excitation electrodes 10 and 11. In this way, a current can be made to flow to the excitation electrodes 10 and 11, and the pair of vibrating arms 3a and 3b are allowed to vibrate at a predetermined frequency in a direction to move closer to or away from each other. This vibration can be used as the time source, the timing source of a control signal, the reference signal source, and the like.

Figure 4:
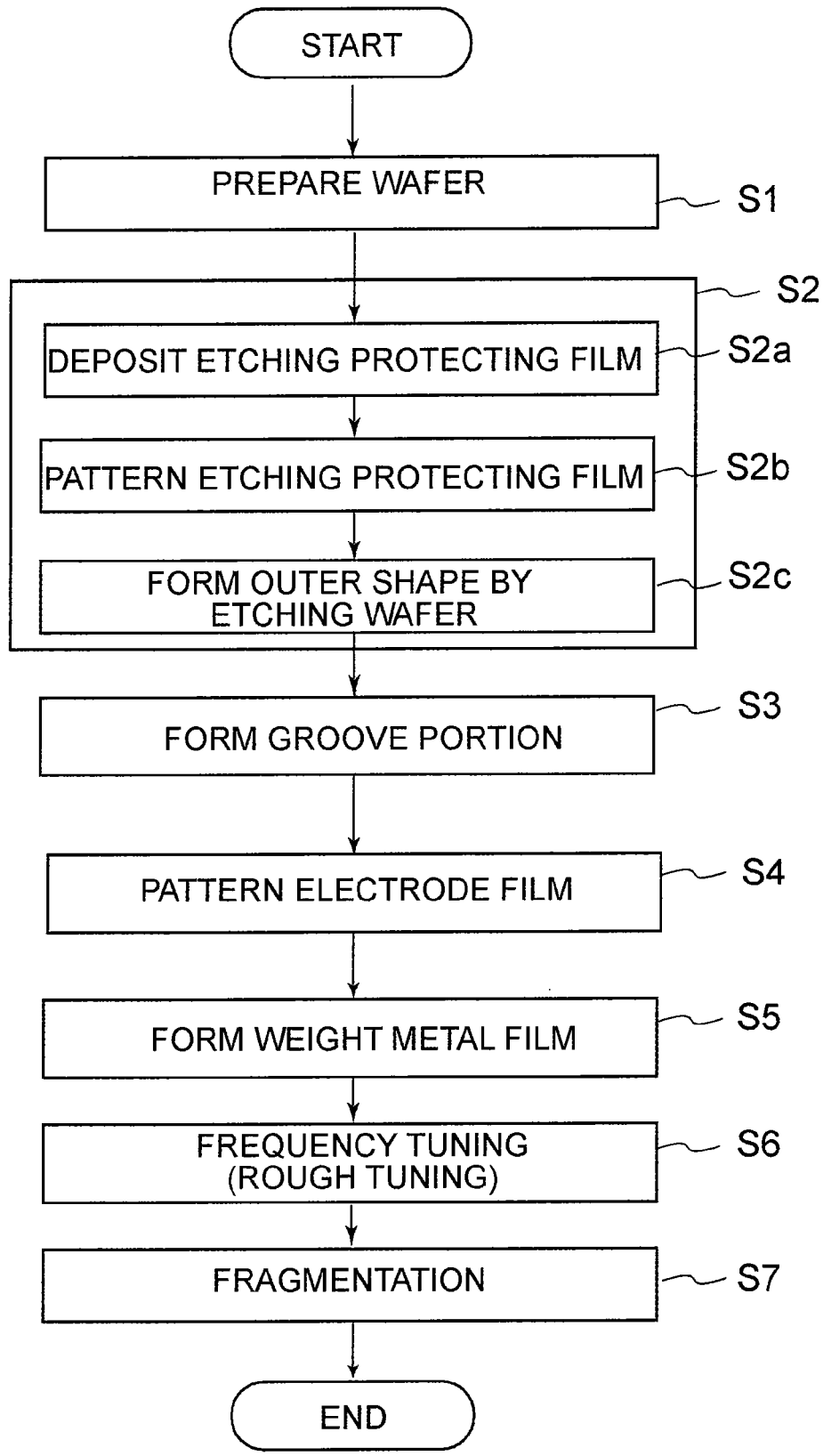
FIG. 4 is a flowchart of the manufacturing method of the piezoelectric vibrating reed shown in FIG. 1.

Next, a method for manufacturing a plurality of the above-described piezoelectric vibrating reeds 1 at a time using a wafer S made of a piezoelectric material will be described with reference to the flowchart shown in FIG. 4.

First, a wafer S having been subjected to polishing and finished highly accurately to a predetermined thickness is prepared (S1). Subsequently, an outer shape forming step is performed where the wafer S is etched by a photolithography technique to form the outer shape of a plurality of piezoelectric plates 2 on the wafer S (S2). This step will be described in detail below.

Figure 5:
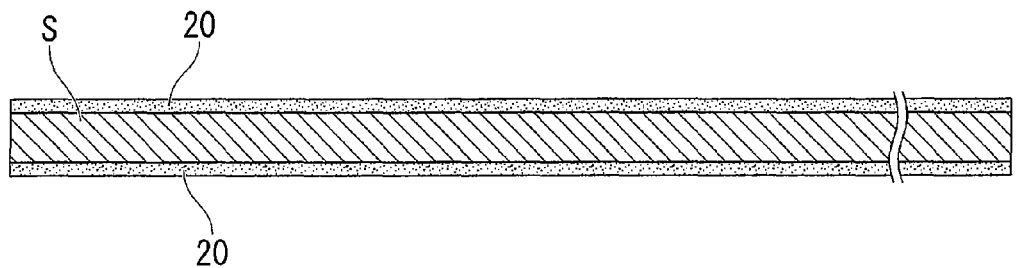
FIG. 5 is a view showing one step of the manufacturing method of the piezoelectric vibrating reed shown in FIG. 1, showing a state where an etching protection film is formed on both surfaces of a wafer.

Initially, as shown in FIG. 5, an etching protection film (protection mask) 20 is deposited on the both surfaces of the wafer S (S2a). As the etching protection film 20, for example, a film of chromium (Cr) having a thickness of about several μm is deposited. Subsequently, a photoresist film (not shown) is patterned on the etching protection film 20 by a photolithographic technique. At this time, the photoresist film is patterned so as to surround the periphery of each piezoelectric plate 2 which includes a vibrating part 3 including a pair of vibrating arms 3a and 3b and a base portion 4 in which a side surface of a mounting portion 4a and a side surface of an intermediate portion 4b are continuous to each other at a step portion between the mounting portion 4a and the intermediate portion 4b via a sloped surface 4c. Moreover, etching is performed using the photoresist film as a mask, so that unmasked regions of the etching protection film 20 are selectively removed. The photoresist film is removed after the etching.

Figure 6:
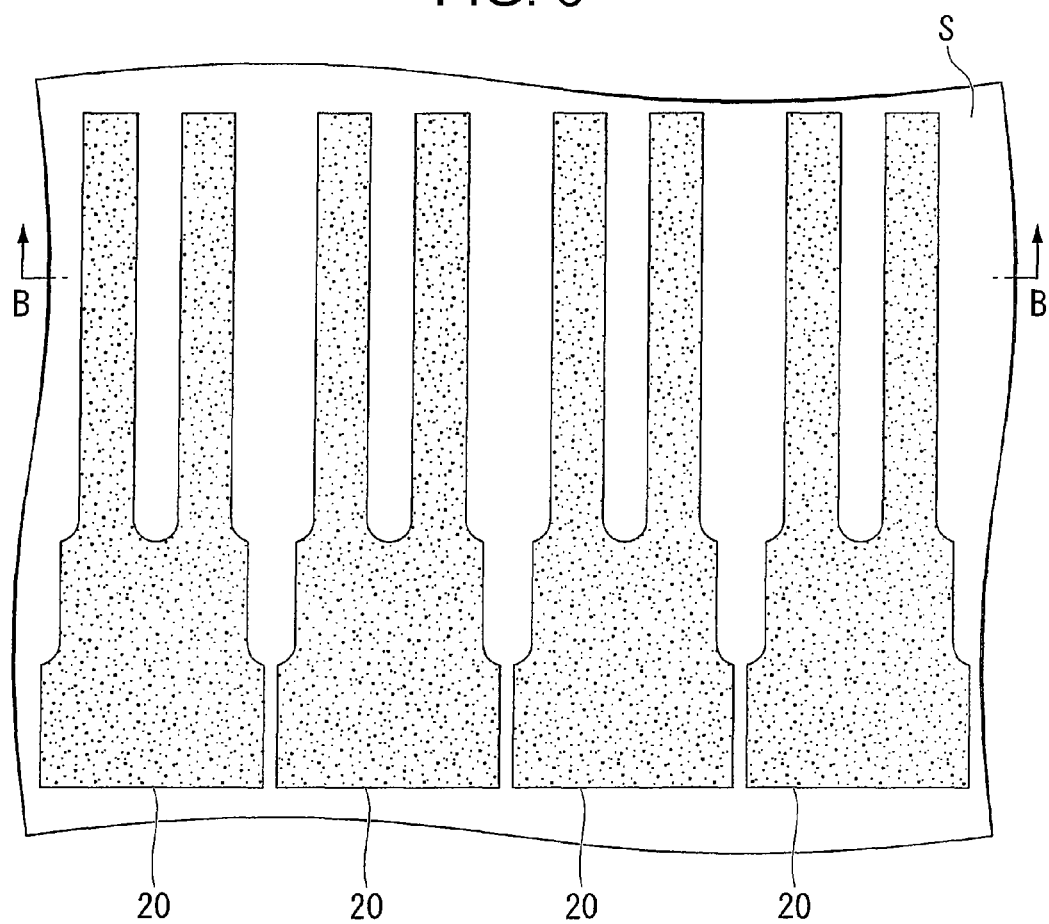
FIG. 6 is a view showing a state where the etching protection film is patterned into the outer shape of the piezoelectric plate of the piezoelectric vibrating reed, obtained from the state shown in FIG. 5.
Figure 7:
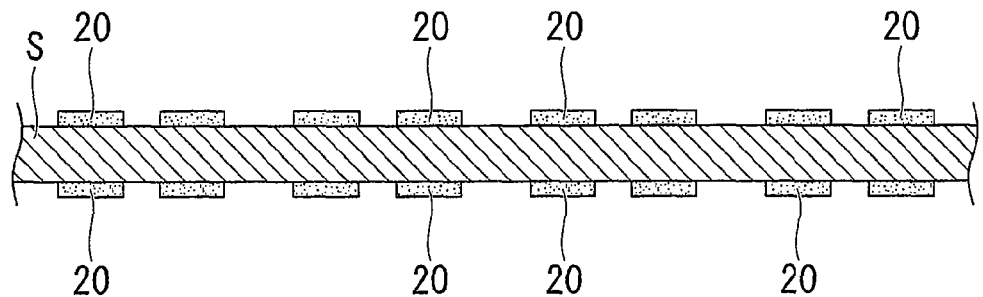
FIG. 7 is a sectional view taken along the line B-B in FIG. 6.

In this way, as shown in FIGS. 6 and 7, the etching protection film 20 is patterned to comply with the outer shape of the piezoelectric plate 2, namely the outer shapes of the pair of vibrating arms 3a and 3b and the base portion 4 (S2b). At this time, patterning is performed by the number of plural piezoelectric plates 2. FIGS. 7 to 10 are sectional views taken along the line B-B in FIG. 6.

Figure 8:
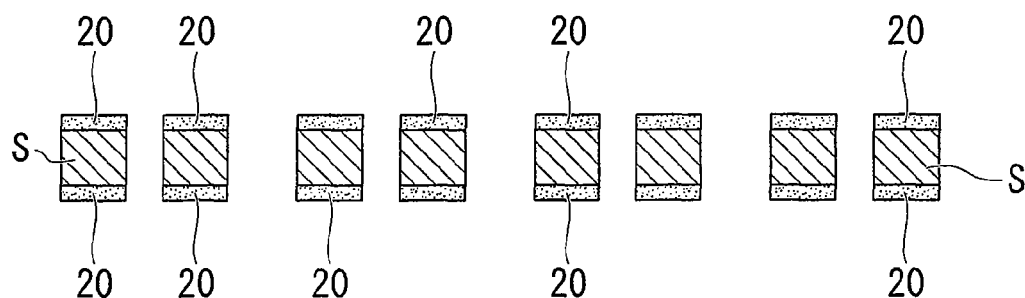
FIG. 8 is a view showing a state where the wafer is etched using the etching protection film as a mask, obtained from the state shown in FIG. 7.

Subsequently, both surfaces of the wafer S are etched using the patterned etching protection film 20 as a mask (S2c). In this way, as shown in FIG. 8, the regions of the piezoelectric plate 2, which are not masked by the etching protection film 20, are selectively removed, and the outer shape of the piezoelectric plate 2 can be formed. The outer shape forming step ends at this point in time.

Figure 9:
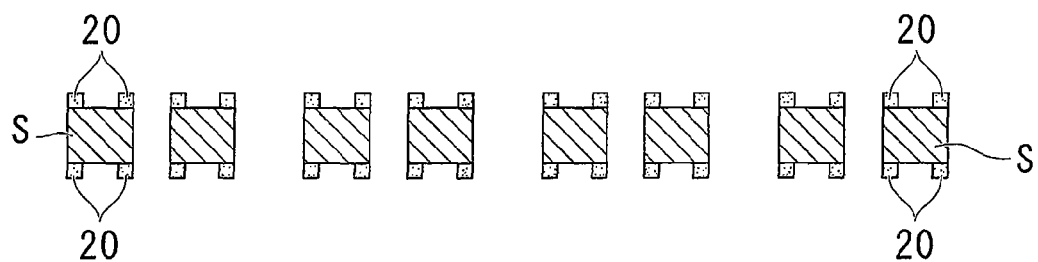
FIG. 9 is a view showing a state where the etching protection film is patterned further, obtained from the state shown in FIG. 8.

Subsequently, a groove forming step is performed where groove portions 5 are formed on the principal surfaces of the pair of vibrating arms 3a and 3b (S3). Specifically, similar to the case of the outer shape forming step described above, a photoresist film is formed on the etching protection film 20. The photoresist film is patterned so as to clear the regions of the groove portions 5 by a photolithography technique. Moreover, etching is performed using the patterned photoresist film as a mask, so that the etching protection film 20 is selectively removed. Thereafter, the photoresist film is removed after the etching, whereby as shown in FIG. 9, the etching protection film 20 which has been patterned in advance can be patterned further in a state where the regions of the groove portions 5 are cleared.

Figure 10:
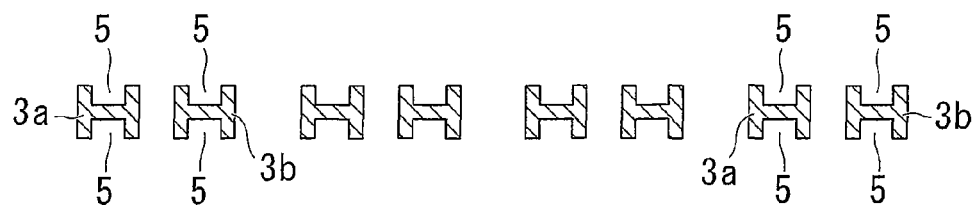
FIG. 10 is a view showing a state where the wafer is etched using the patterned etching protection film as a mask, obtained from the state shown in FIG. 9.

Subsequently, the wafer S is etched using the etching protection film 20 having been patterned again as a mask, and then, the etching protection film 20 used as the mask is removed. In this way, as shown in FIG. 10, the groove portions 5 can be formed on both principal surfaces of the pair of vibrating arms 3a and 3b.

The plurality of piezoelectric plates 2 remain in a state where they are connected to the wafer S via connection portions not shown until a cutting step which is performed later is performed.

Subsequently, an electrode forming step is performed where an electrode film is patterned on the outer surface of the plurality of piezoelectric plates 2 by performing exposure through a mask not shown, thus forming excitation electrodes 10 and 11, an extraction electrode 14, and mount electrodes 12 and 13 (S4).

Subsequently, after the electrode forming step is completed, a weight metal film 15 (for example, silver or gold) including a rough tuning film 15a and a fine tuning film 15b for frequency tuning is formed at the tip end of the pair of vibrating arms 3a and 3b (S5). A rough tuning step is then performed where the resonance frequency of all the vibrating arms 3a and 3b formed on the wafer is adjusted roughly (S6). This is achieved by irradiating the rough tuning film 15a of the weight metal film 15 with laser light to partly evaporate the rough tuning film 15a, thus changing a weight thereof Fine tuning of adjusting the resonance frequency more accurately is performed at the time of manufacturing the piezoelectric vibrator.

As a final step, a cutting step is performed where the connection portions connecting the wafer S and the piezoelectric plates 2 are cut so that the plurality of piezoelectric plates 2 are separated from the wafer S to obtain small fragments (S7). In this way, a plurality of turning-fork type piezoelectric vibrating reeds 1 can be manufactured from one wafer S at a time. The manufacturing step of the piezoelectric vibrating reed 1 ends at this point in time, and the piezoelectric vibrating reed 1 shown in FIG. 1 can be obtained.

During the outer shape forming step, the etching protection film 20 is used whose outer shape is preformed so as to comply with the outer shape of the base portion 4 in which the sloped surface 4c is formed in the step portion between the mounting portion 4a and the intermediate portion 4b, and the side surface of the mounting portion 4a and the side surface of the intermediate portion 4b is made continuous to each other by the sloped surface 4c. Therefore, by etching the wafer using the etching protection film 20, it is possible to obtain the base portion 4 in which the side surface of the mounting portion 4a and the side surface of the intermediate portion 4b are made continuous to each other by the sloped surface 4c, and the horizontal width W1 of the mounting portion 4a is greater than the horizontal width W2 of the intermediate portion 4b.

Particularly, unlike the piezoelectric vibrating reed of the related art in which the notch portion is formed in a direction opposite to the crystal direction of the wafer, since the side surface of the mounting portion 4a and the side surface of the intermediate portion 4b is continuous to each other at the step portion between the mounting portion 4a and the intermediate portion 4b by the sloped surface 4c which can be easily formed along the crystal direction of the wafer S, the formation state of the sloped surface 4c will rarely change depending on a change in the etching time. That is to say, the slope angle θ of the sloped surface 4c will rarely change even when the etching time is increased or decreased. Therefore, it is possible to decrease the variation in the amount of etching residue as much as possible and to adjust the length L of the intermediate portion 4b shown in FIG. 2 to a uniform length every time, the length which is ideal for a countermeasure against vibration loss. That is to say, it is possible to form the outer shape of the intermediate portion 4b without being influenced by the change in the etching time and to match the length (effective value) L of the intermediate portion 4b to the designed value as much as possible. Therefore, it is possible to take effective countermeasures against the vibration loss.

As a result, it is possible to suppress the influence of the vibration loss on the vibration characteristics and to thus obtain a high-quality piezoelectric vibrating reed 1.

Moreover, in the present embodiment, since the angle θ between the side surface of the mounting portion 4a and the sloped surface 4c is set to 45° which is within the range of 30° and 60°, it is better able to make the sloped surface 4c identical with the crystal direction of the wafer S. Therefore, it is possible to suppress the variation in the amount of etching residue to the minimum level even when the etching time changes. Accordingly, it is possible to stabilize the influence of the vibration loss on the vibration characteristics.

Glass-Packaged Piezoelectric Vibrator

Next, a piezoelectric vibrator according to an embodiment of the present invention will be described with reference to FIGS. 11 to 14. The present embodiment will be described by way of an example of a glass-packaged piezoelectric vibrator of the surface-mounting type as an example of the piezoelectric vibrator.

As shown in FIGS. 11 to 14, a piezoelectric vibrator 30 of the present embodiment is a piezoelectric vibrator which is formed in the form of a box laminated in two layers of a base board 31 and a lid board 32 and in which the above-described turning-fork type piezoelectric vibrating reed 1 is accommodated in a cavity C at an inner portion thereof.

Figure 11:
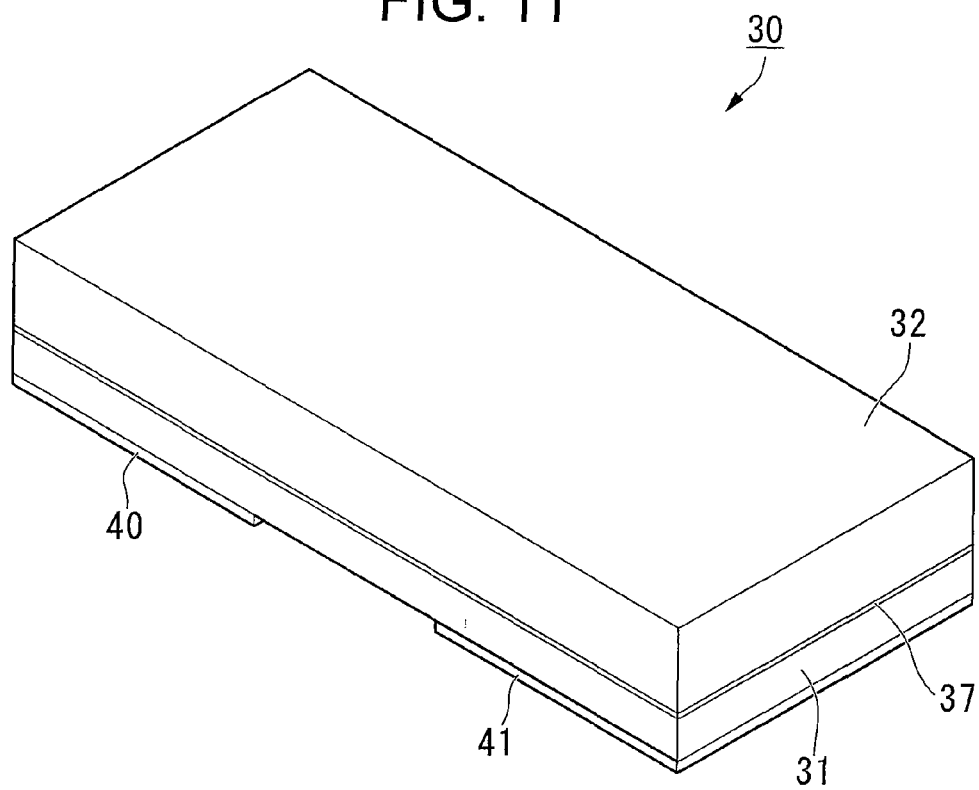
FIG. 11 is a perspective view showing an external appearance of a piezoelectric vibrator according to an embodiment of the present invention.
Figure 12:
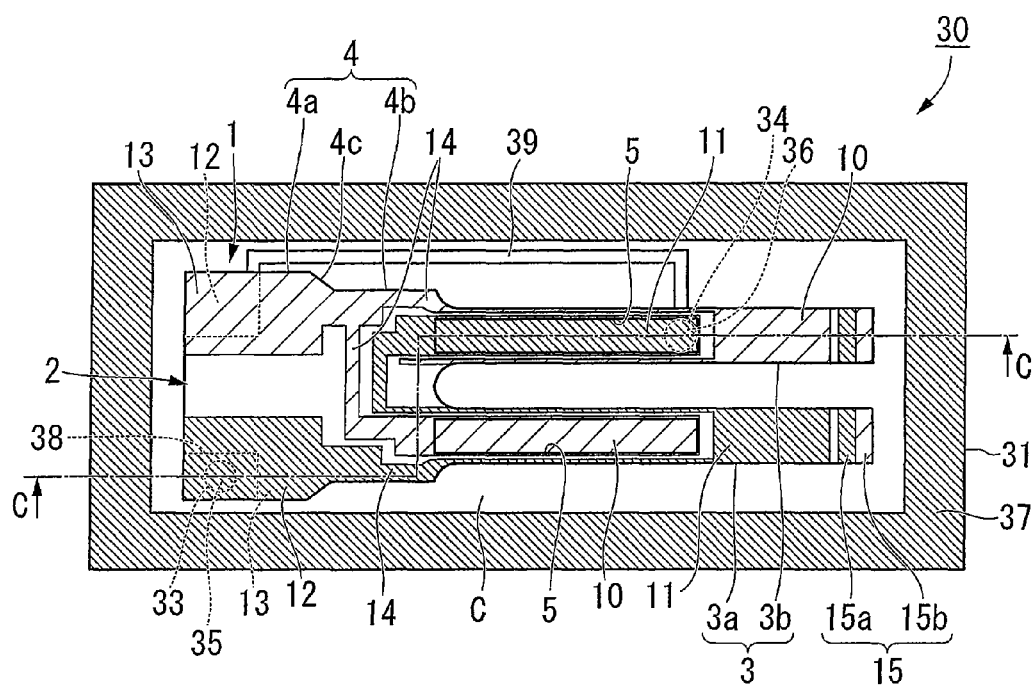
FIG. 12 is a top view showing an internal structure of the piezoelectric vibrator shown in FIG. 11 when a piezoelectric vibrating reed is viewed from above with a lid board removed.
Figure 13:
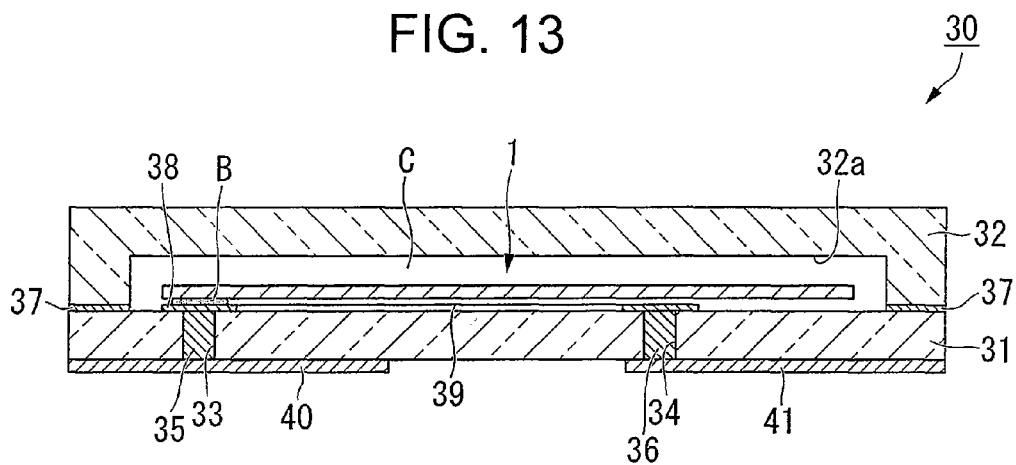
FIG. 13 is a sectional view of the piezoelectric vibrator taken along the line C-C in FIG. 12.
Figure 14:
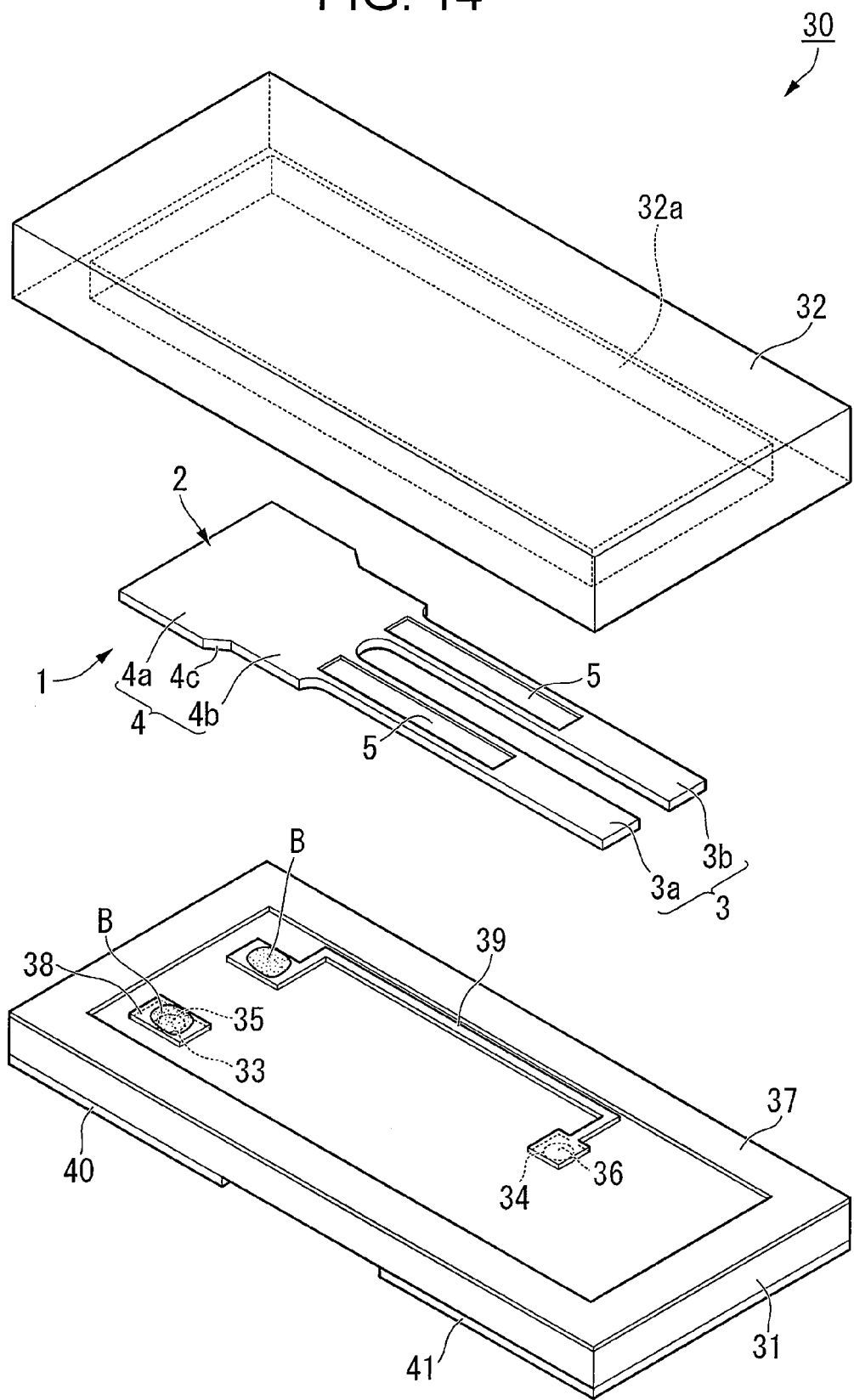
FIG. 14 is an exploded perspective view of the piezoelectric vibrator shown in FIG. 11.

FIG. 11 is a perspective view showing an external appearance of the piezoelectric vibrator 30. FIG. 12 is a top view showing an internal structure of the piezoelectric vibrator 30 shown in FIG. 11, showing a state where the lid board 32 is removed. FIG. 13 is a sectional view of the piezoelectric vibrator 30 taken along the line C-C in FIG. 12. FIG. 14 is an exploded perspective view of the piezoelectric vibrator 30. In FIG. 14, the respective electrodes of the piezoelectric vibrating reed 1 are not shown.

The piezoelectric vibrating reed 1 is mounted on an upper surface of the base board 31 by bump bonding using bumps B made of gold or the like. More specifically, bump bonding is achieved in a state where the pair of mount electrodes 12 and 13 come into contact with two bumps B formed on lead-out electrodes 38 and 39 described later, respectively, which are patterned on the upper surface of the base board 31. In this way, the piezoelectric vibrating reed 1 is supported in a state of being floated from the upper surface of the base board 31, and the mount electrodes 12 and 13 and the lead-out electrodes 38 and 39 are electrically connected to each other.

The lid board 32 is a transparent insulating board made of a glass material, for example, soda-lime glass, and is formed in a board-like form as shown in FIGS. 11, 13, and 14. A bonding surface side thereof to be bonded with the base board 31 is formed with a rectangular recess portion 32a in which the piezoelectric vibrating reed 1 is accommodated. The recess portion 32a is a recess portion for a cavity serving as the cavity C that accommodates the piezoelectric vibrating reed 1 when the two boards 31 and 32 are overlapped with each other. The lid board 32 is anodically bonded to the base board 31 in a state where the recess portion 32a faces the base board 31.

The base board 31 is a transparent insulating board made of glass material, for example, soda-lime glass, similarly to the lid board 32, and is formed in a board-like form having a size capable of being overlapped with the lid board 32, as shown in FIGS. 11 to 14.

The base board 31 is formed with a pair of through-holes 33 and 34 penetrating through the base board 31. At this time, the pair of through-holes 33 and 34 are formed so as to be received in the cavity C. More specifically, one through-hole 33 is positioned close to the base portion 4 of the mounted piezoelectric vibrating reed 1, and the other through-hole 34 is positioned close to the tip end portions of the vibrating arm 3b.

Although the present embodiment is described by way of an example of the through-holes 33 and 34 which are configured to penetrate straight through the base board 31, the present invention is not limited to this example, but for example, the through-holes may be formed in a tapered form whose diameter gradually decreases towards the lower surface of the base board 31. In any case, they only need to penetrate through the base board 31.

The pair of through-holes 33 and 34 are formed with a pair of through-hole electrodes 35 and 36 which are formed so as to bury the through-holes 33 and 34. The through-hole electrodes 35 and 36 serve to maintain air-tightness of the inside of the cavity C by completely closing the through-holes 33 and 34 and achieve electrical connection between outer electrodes 40 and 41 described later and the lead-out electrodes 38 and 39.

The upper surface side of the base board 31 (the bonding surface side to be bonded to the lid board 32) is patterned with a bonding film 37 for anodic bonding and the pair of lead-out electrodes 38 and 39 by a conductive material (for example, aluminum). Among them, the bonding film 37 is formed along the peripheral edge of the base board 31 so as to surround the periphery of the recess portion 32a formed on the lid board 32.

Moreover, the pair of lead-out electrodes 38 and 39 are patterned so that one through-hole electrode 35 of the pair of through-hole electrodes 35 and 36 are electrically connected to one mount electrode 12 of the piezoelectric vibrating reed 1, and the other through-hole electrode 36 is electrically connected to the other mount electrode 13 of the piezoelectric vibrating reed 1.

More specifically, as shown in FIGS. 12 to 14, one lead-out electrode 38 is formed right above one through-hole electrode 35 to be disposed right below the base portion 4 of the piezoelectric vibrating reed 1. Moreover, the other lead-out electrode 39 is formed to be disposed right above the other through-hole electrode 36 after being led out from a position near one lead-out electrode 38 towards the tip end of the vibrating arm 3b along the vibrating arm 3b.

The bumps B are formed on the pair of lead-out electrodes 38 and 39, and the piezoelectric vibrating reed 1 is mounted via the bumps B. In this way, one mount electrode 12 of the piezoelectric vibrating reed 1 is electrically connected to one through-hole electrode 35 via one lead-out electrode 38, and the other mount electrode 13 is electrically connected to the other through-hole electrode 36 via the other lead-out electrode 39.

Moreover, the lower surface of the base board 31 is formed with the outer electrodes 40 and 41 which are electrically connected to the pair of through-hole electrodes 35 and 36, respectively, as shown in FIGS. 11, 13, and 14. In this way, the pair of outer electrodes 40 and 41 are electrically connected to the pair of excitation electrodes 10 and 11 of the piezoelectric vibrating reed 1 via the pair of through-hole electrodes 35 and 36 and the pair of lead-out electrodes 38 and 39.

When the piezoelectric vibrator 30 configured in this manner is operated, a predetermined drive voltage is applied between the pair of outer electrodes 40 and 41. In this way, a current can be made to flow to the excitation electrodes 10 and 11 of the piezoelectric vibrating reed 1, and the pair of vibrating arms 3a and 3b are allowed to vibrate at a predetermined frequency in a direction to move closer to or away from each other. This vibration can be used as the time source, the timing source of a control signal, the reference signal source, and the like.

According to the piezoelectric vibrator 30 of the present embodiment, since the piezoelectric vibrator includes the high-quality piezoelectric vibrating reed 1 in which the influence of the vibration loss on the vibration characteristics is very small, it is possible to obtain a high-quality piezoelectric vibrator 30 having improved reliability.

Moreover, since the piezoelectric vibrator 30 is a glass-packaged piezoelectric vibrator of the surface-mounting type in which the piezoelectric vibrating reed 1 is hermetically sealed in the cavity C, it is possible to allow the piezoelectric vibrating reed 1 to vibrate without being affected by dust or the like and achieve high quality. In addition, since the piezoelectric vibrator 30 is a surface-mounting type piezoelectric vibrator, the piezoelectric vibrator can be mounted easily and has excellent stability after being mounted.

Cylinder-Packaged Piezoelectric Vibrator

Figure 15:
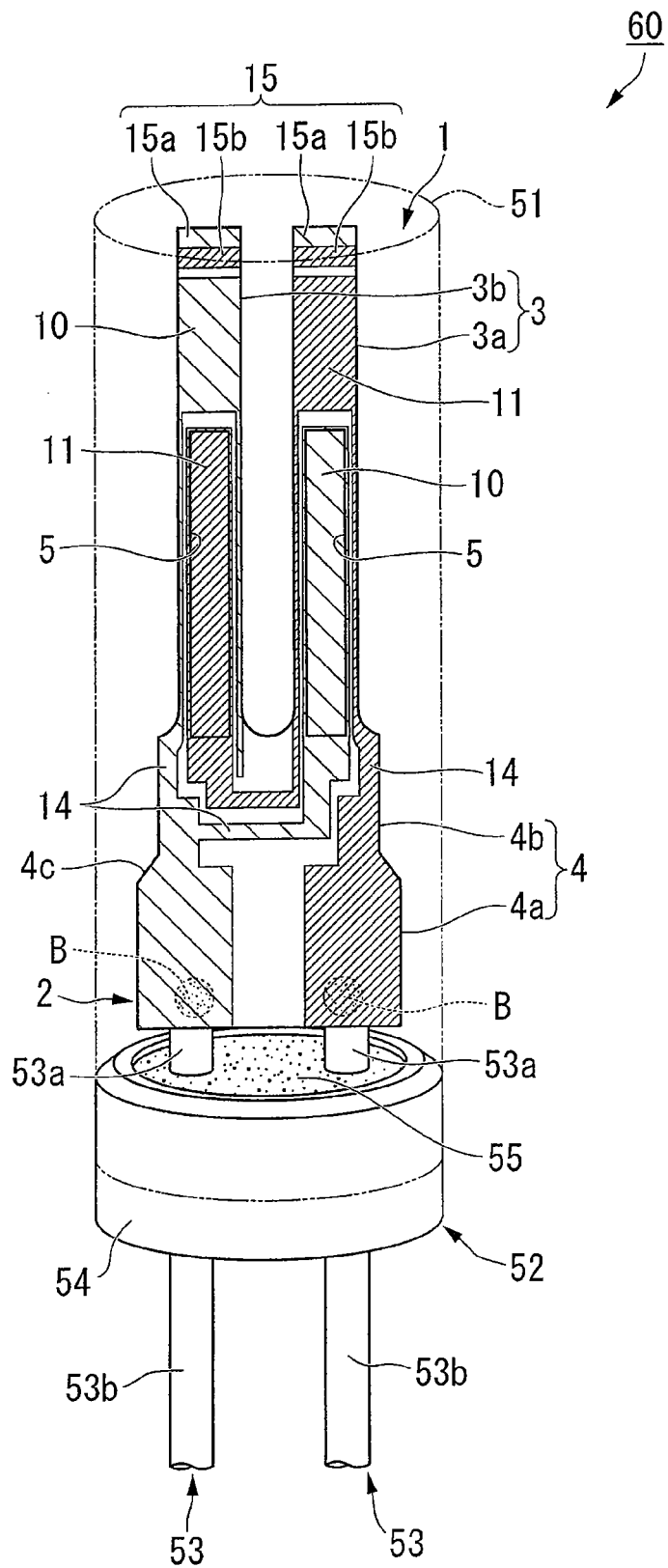
FIG. 15 is a top view of a cylinder package-type piezoelectric vibrator according to a modification of the present invention.

Next, a piezoelectric vibrator according to an embodiment of the present invention will be described with reference to FIG. 15. The present embodiment will be described by way of an example of a cylinder-packaged piezoelectric vibrator as an example of the piezoelectric vibrator.

A piezoelectric vibrator 50 of the present embodiment includes the piezoelectric vibrating reed 1, a case 51 that accommodates therein the piezoelectric vibrating reed 1, and an airtight terminal 52 that hermetically seals the piezoelectric vibrating reed 1 inside the case 51. FIG. 15 is a top view of the piezoelectric vibrator 50.

The piezoelectric vibrating reed 1 is mounted on inner leads 53a of lead terminals 53 constituting the airtight terminal 52 in a state of being accommodated in the case 51.

The case 51 is formed in the form of a bottomed cylinder and is press-fit to be tightly fitted to an outer periphery of a stem 54, described later, of the airtight terminal 52. The case 51 is press-fitted in a vacuum and a space surrounding the piezoelectric vibrating reed 1 in the case 51 is in a state of being maintained in vacuum.

The airtight terminal 52 hermetically seals the inside of the case 51 and includes the stem 54 that is press-fit to be fixed to the inside of the case 51, two lead terminals 53 which are disposed in a state of penetrating through the stem 54 while interposing the stem 54 therebetween, in which one ends thereof serve as the inner leads 53a electrically connected to the pair of mount electrodes 12 and 13 of the piezoelectric vibrating reed 1, and the other ends thereof serve as outer leads 53b electrically connected to the outside, and a filling member 55 that fixes the lead terminals 53 and the stem 54.

The stem 54 is formed in a ring-like shape by a metal material (for example, low-carbon steel (Fe)), iron nickel alloy (Fe—Ni), iron nickel cobalt alloy (Fe—Ni—Co)). Moreover, the filling member 55 is made, for example, of borosilicate glass. It should be noted that an outer periphery of the stem 54 is coated with a plating (metal film) made of the same material as the lead terminals 53.

The lead terminals 53 are made, for example, of a conductive material which is the same material as the stem 54, in which portions thereof being projected to the inside of the case 51 serve as the inner leads 53a, and portions thereof being projected to the outside of the case 51 serve as the outer leads 53b. The piezoelectric vibrating reed 1 is mechanically mounted by conductive bumps B made of gold or the like in a state of being mounted on the tip ends of the inner leads 53a. That is to say, the inner leads 53a and the mount electrodes 12 and 13 are mechanically bonded and electrically connected by the bumps B. As a result, the piezoelectric vibrating reed 1 is brought into a state of being mounted on two lead terminals 53.

As a material of the plating of the stem 54 and the lead terminals 53, heat-resistant solder plating, tin copper alloy, gold tin alloy or the like is used. Moreover, by cold-welding the stem 54 to the case 51 in a vacuum with the plating on the outer periphery of the stem 54 interposed therebetween, the inside of the case 51 can be hermetically sealed in a vacuum state.

According to the piezoelectric vibrator 50 configured in this manner, since the piezoelectric vibrator includes the high-quality piezoelectric vibrating reed 1 in which the influence of the vibration loss on the vibration characteristics is very small, it is possible to obtain a high-quality piezoelectric vibrator with improved reliability.

Moreover, since the piezoelectric vibrator 50 is a cylinder-packaged piezoelectric vibrator in which the piezoelectric vibrating reed 1 is hermetically sealed in the case 51, it is possible to allow the piezoelectric vibrating reed 1 to vibrate without being affected by dust or the like and achieve high quality.

Oscillator

Next, an oscillator according to an embodiment of the present invention will be described with reference FIG. 16.

Figure 16:
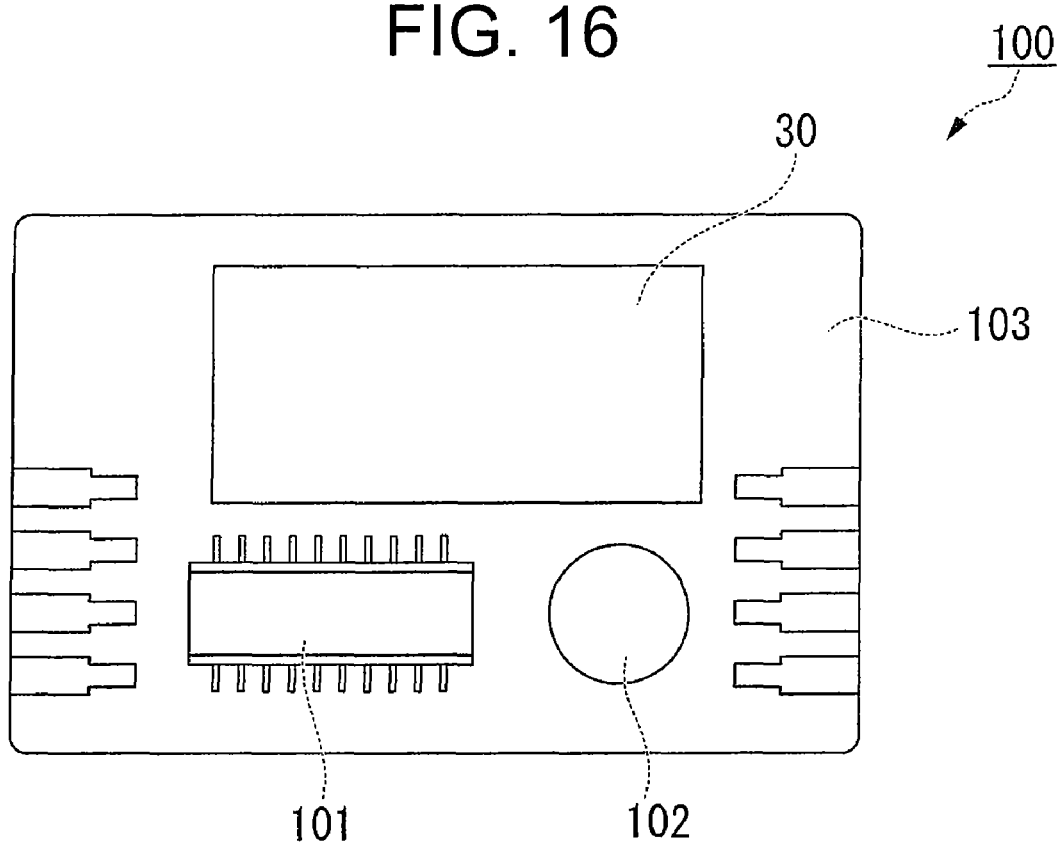
FIG. 16 is a view showing the configuration of an oscillator according to an embodiment of the present invention.

As shown in FIG. 16, an oscillator 100 of the present embodiment is one in which the piezoelectric vibrator 30 is configured as an oscillating piece that is electrically connected to an integrated circuit 101. It should be noted that the piezoelectric vibrator 50 may be incorporated into the oscillator.

The oscillator 100 includes a board 103 on which an electronic component 102 such as a capacitor is mounted. The integrated circuit 101 for the oscillator is mounted on the board 103, and the piezoelectric vibrating reed 1 of the piezoelectric vibrator 30 is mounted in the vicinity of the integrated circuit 101.

These electronic components 102, integrated circuit 101, and piezoelectric vibrator 30 are electrically connected by a wiring pattern which is not shown. It should be noted that these components are molded by resin which is not shown.

In the oscillator 100 configured in this manner, the piezoelectric vibrating reed 1 in the piezoelectric vibrator 30 vibrates when a voltage is applied to the piezoelectric vibrator 30. This vibration is converted to an electrical signal by the piezoelectric characteristics of the piezoelectric vibrating reed 1 and is then input to the integrated circuit 101 as the electrical signal. The input electrical signal is subjected to various kinds of processing by the integrated circuit 101 and is then output as a frequency signal. In this way, the piezoelectric vibrator 30 functions as an oscillating piece.

By selectively setting the configuration of the integrated circuit 101, for example, an RTC (Real Time Clock) module, according to the demands, it is possible to add a function of controlling the date or time for operating the device or an external device or providing the time or calendar other than a single-function oscillator for a clock.

According to the oscillator 100 of the present embodiment, since the oscillator includes the piezoelectric vibrator 30 described above, it is possible to achieve improvement in the reliability and high quality of the oscillator 100 itself. In addition to this, it is possible to obtain a highly accurate frequency signal which is stable over a long period of time.

Electronic Device

Next, an electronic device according to an embodiment of the present invention will be described with reference to FIG. 17. The present embodiment will be described by way of an example of a portable information device 110 having the piezoelectric vibrator 30 as asp an example of the electronic device. It should be noted that the piezoelectric vibrator 50 may be incorporated into the portable information device.

First, the portable information device 110 of the present embodiment is represented, for example, by a cellular phone and is one that developed and improved a wristwatch of the related art. The portable information device 110 looks like a wristwatch in external appearance and is provided with a liquid crystal display at a portion corresponding to the dial pad and is capable of displaying the current time or the like on the screen. When the portable information device 110 is used as a communication tool, the user removes it from the wrist and makes communications as with a cellular phone of the related art using the internal speaker and microphone on the inner side of its strap. However, the portable information device 110 is remarkably small and light compared with the cellular phone of the related art. Next, the configuration of the portable information device 110 of the present embodiment will be described.

Figure 17:
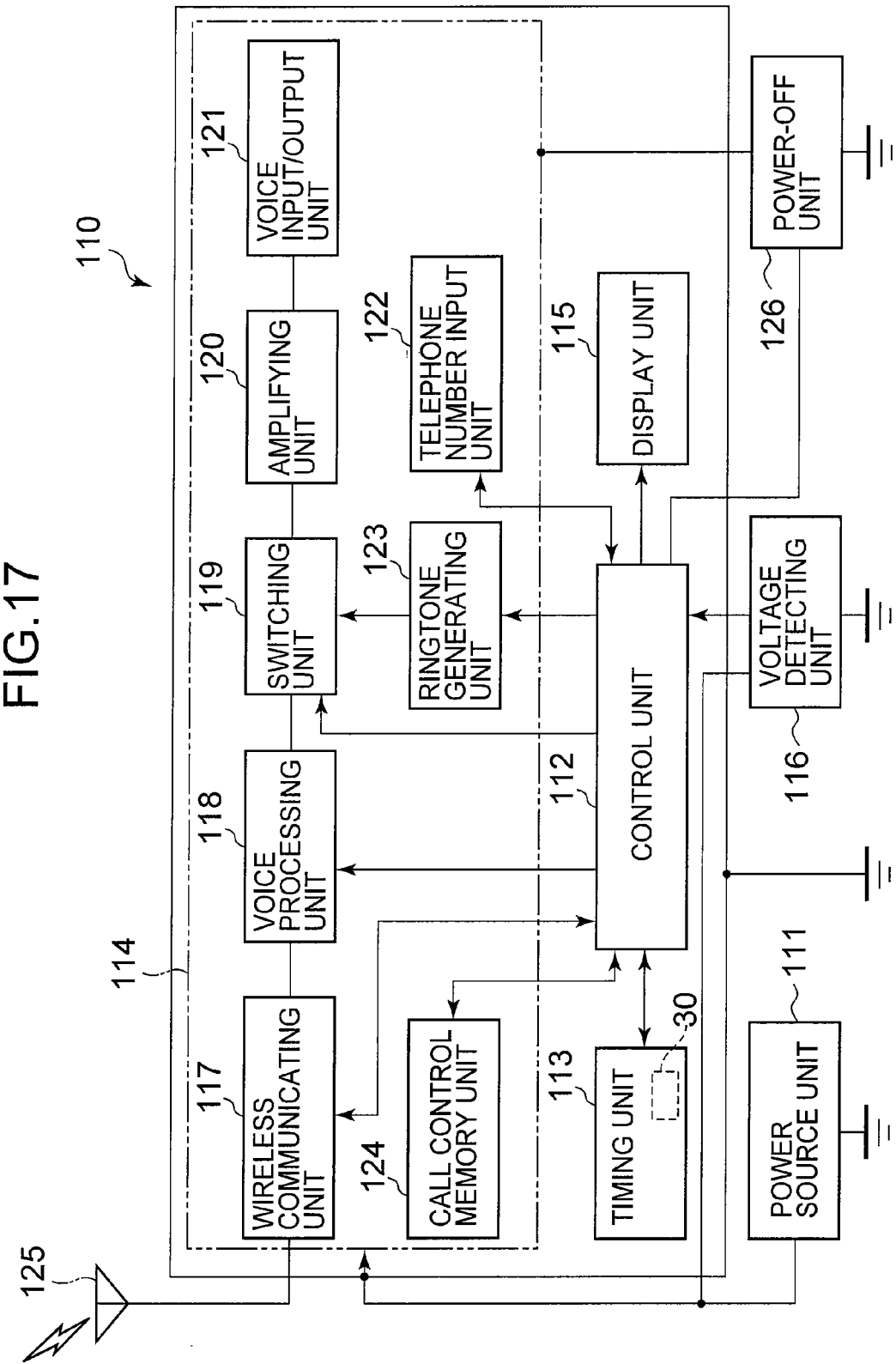
FIG. 17 is a view showing the configuration of an electronic device according to an embodiment of the present invention.

As shown in FIG. 17, the portable information device 110 includes the piezoelectric vibrator 30 and a power supply portion 111 for supplying power. The power supply portion 111 is formed, for example, of a lithium secondary battery. The power supply portion 111 is connected in parallel to a control portion 112 that performs various kinds of control, a time counting portion 113 that counts the time or the like, a communication portion 114 that makes communications with the outside, a display portion 115 that displays various kinds of information, and a voltage detection portion 116 that detects voltages at the respective function portions. The power supply portion 111 supplies power to the respective functional portions.

The control portion 112 controls the respective function portions so as to control operations of the overall system, such as operations to transmit and receive sound data and operations to count and display the current time. The control portion 112 includes a ROM in which a program is written in advance, a CPU that reads out and runs the program written to the ROM, a RAM used as a work area of the CPU, and the like.

The time counting portion 113 includes an integrated circuit enclosing an oscillation circuit, a register circuit, a counter circuit, and an interface circuit, and the like as well as the piezoelectric vibrator 30. When a voltage is applied to the piezoelectric vibrator 30, the piezoelectric vibrating reed 1 vibrates, and this vibration is converted to an electrical signal by the piezoelectric characteristics of the quartz and is input to the oscillation circuit as the electrical signal. The output of the oscillation circuit is converted to a digital form and counted by the register circuit and the counter circuit. Signals are transmitted and received to and from the control portion 112 via the interface circuit, and the current time and the current date or the calendar information or the like are displayed on the display portion 115.

The communication portion 114 is provided with the same functions as those of the cellular phone of the related art, and includes a wireless portion 117, a sound processing portion 118, a switching portion 119, an amplifier portion 120, a sound input/output portion 121, a telephone number input portion 122, a ring tone generation portion 123, and a call control memory portion 124.

The wireless portion 117 carries out transmission and reception of various kinds of data, such as sound data, with the base station via an antenna 125. The sound processing portion 118 encodes and decodes a sound signal input therein from the wireless portion 117 or the amplifier portion 120. The amplifier portion 120 amplifies a signal input therein from the sound processing portion 118 or the sound input/output portion 121 to a predetermined level. The sound input/output portion 121 is formed of a speaker and a microphone, and makes a ring tone and an incoming sound louder as well as collects sounds.

The ring tone generation portion 123 generates a ring tone in response to a call from the base station. The switching portion 119 switches the amplifier portion 120 normally connected to the sound processing portion 118 to the ring tone generation portion 123 only when a call arrives, so that the ring tone generated in the ring tone generation portion 123 is output to the sound input/output portion 121 via the amplifier portion 120.

The call control memory portion 124 stores a program relating to incoming and outgoing call control for communications. The telephone number input portion 122 includes, for example, numeric keys from 0 to 9 and other keys and the user inputs the telephone number of the communication party by depressing these numeric keys.

The voltage detection portion 116 detects a voltage drop when a voltage being applied to each function portion, such as the control portion 112, by the power supply portion 111 drops below the predetermined value, and notifies the control portion 112 of the detection. The predetermined voltage value referred to herein is a value pre-set as the lowest voltage necessary to operate the communication portion 114 in a stable manner, and for example, about 3 V. Upon receipt of a notification of a voltage drop from the voltage detection portion 116, the control portion 112 disables the operation of the wireless portion 117, the sound processing portion 118, the switching portion 119, and the ring tone generation portion 123. In particular, it is essential to stop the operation of the wireless portion 117 that consumes a large amount of power. Furthermore, a message informing that the communication portion 114 becomes unavailable due to insufficient battery power is displayed on the display portion 115.

More specifically, it is possible to disable the operation of the communication portion 114 and display the notification message on the display portion 115 by the voltage detection portion 116 and the control portion 112. This message may be displayed as a character message, or as a more intuitive indication, which may be displayed by putting a cross mark on the telephone icon displayed at the top of the display screen of the display portion 115.

By providing a power shutdown portion 126 capable of selectively shutting down the power supply to portions involved with the function of the communication portion 114, it is possible to stop the function of the communication portion 114 in a more reliable manner.

According to the portable information device 110 of the present embodiment, since the portable information device includes the piezoelectric vibrator 30 described above, it is possible to achieve improvement in the reliability of the portable information device itself and high quality. In addition to this, it is possible to display highly accurate clock information which is stable over a long period of time.

Radio-Controlled Clock

Figure 18:
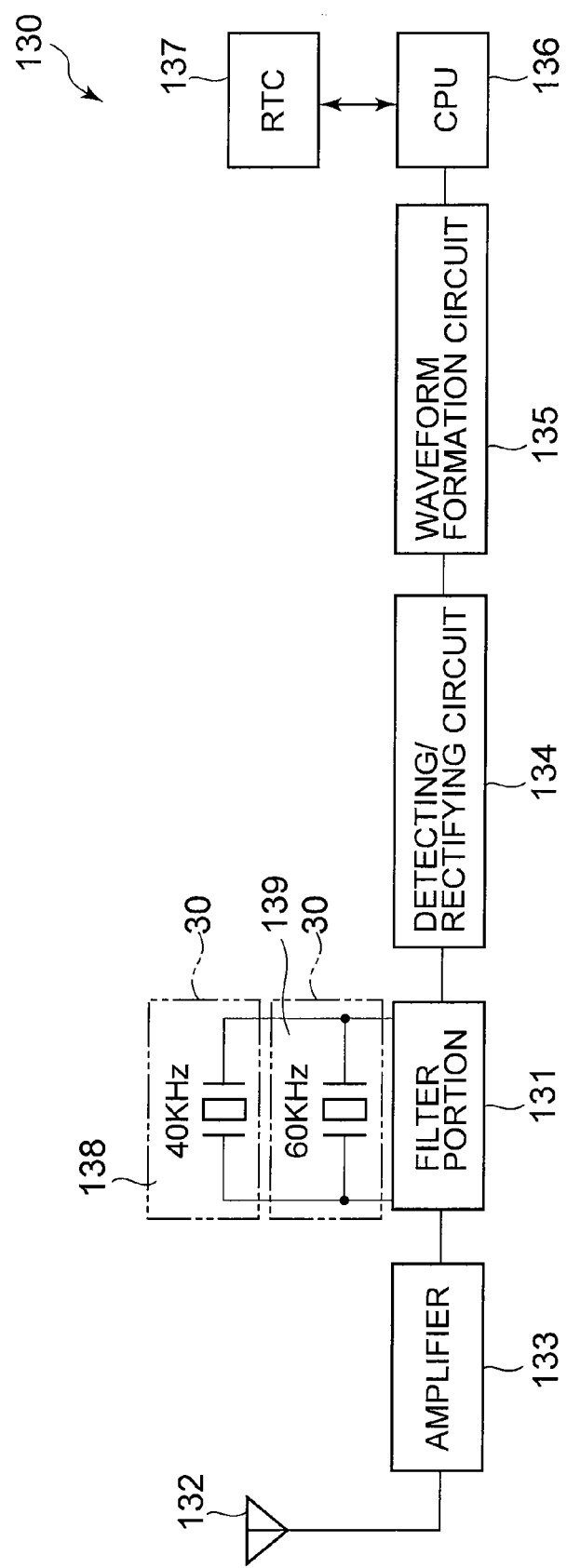
FIG. 18 is a view showing the configuration of a radio-controlled clock according to an embodiment of the present invention.
Figure 19:
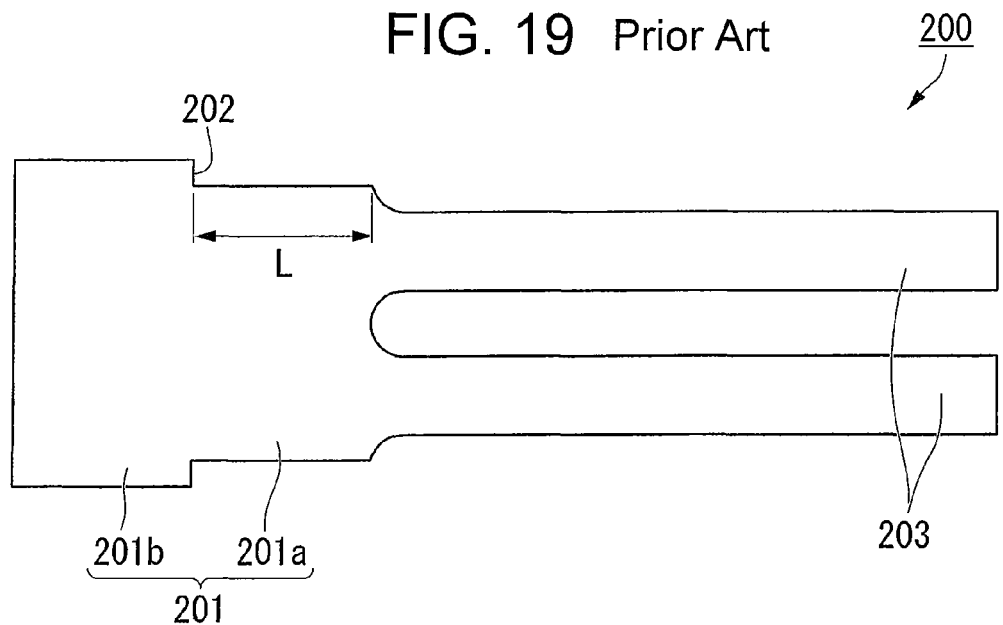
FIG. 19 is a top view showing an example of a piezoelectric vibrating reed according to the related art.
Figure 20:
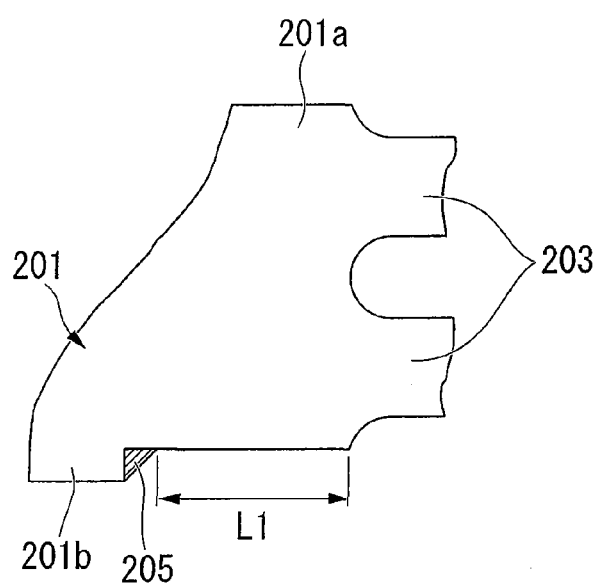
FIG. 20 is a view showing a state where lots of etching residue remain in a step portion between a mounting portion and an intermediate portion when the piezoelectric vibrating reed shown in FIG. 19 is manufactured.
Figure 21:
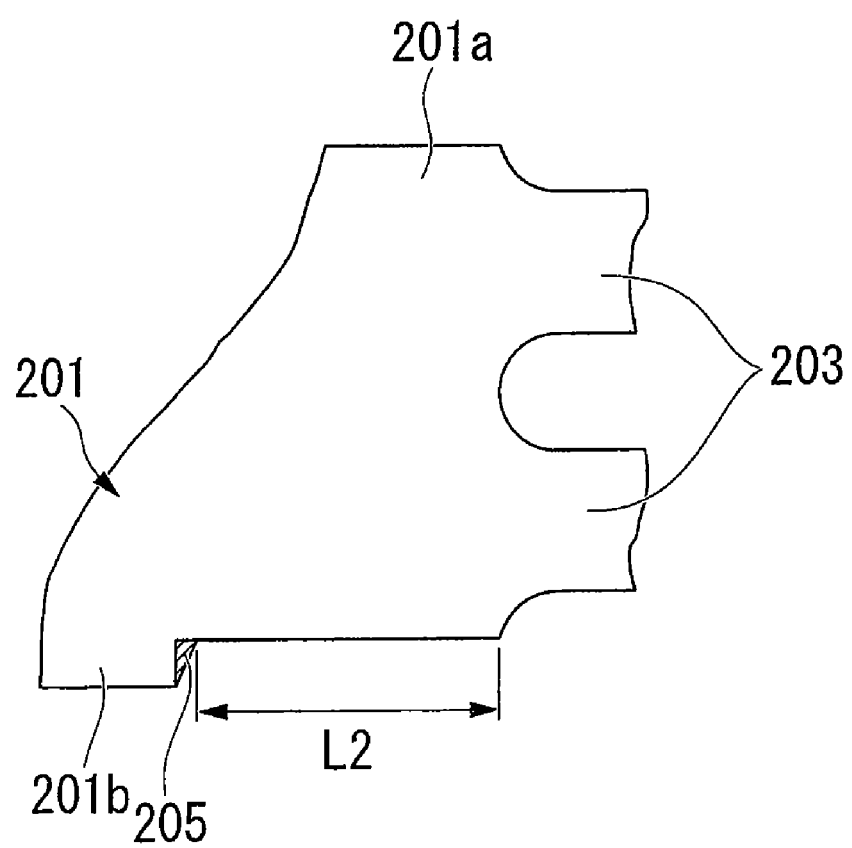
FIG. 21 is a view showing a state where a little etching residue remains in the step portion between the mounting portion and the intermediate portion when the piezoelectric vibrating reed shown in FIG. 19 is manufactured.

Next, a radio-controlled clock 130 according to an embodiment of the present invention will be described with reference to FIG. 18. As shown in FIG. 18, the radio-controlled clock 130 of the present embodiment includes the piezoelectric vibrators 30 electrically connected to a filter portion 131. The radio-controlled clock 130 is a clock provided with the function of displaying the correct time by automatically correcting the time upon receipt of a standard radio wave including the clock information. It should be noted that the piezoelectric vibrator 50 may be incorporated into the radio-controlled clock.

In Japan, there are transmission centers (transmission stations) that transmit a standard radio wave in Fukushima Prefecture (40 kHz) and Saga Prefecture (60 kHz), and each center transmits the standard radio wave. A wave as long as 40 kHz or 60 kHz has a nature to propagate along the land surface and a nature to propagate while reflecting between the ionospheric layer and the land surface, and therefore has a propagation range wide enough to cover all Japan by the two transmission centers.

Hereinafter, the functional configuration of the radio-controlled clock 130 will be described in detail.

An antenna 132 receives the long standard radio wave at 40 kHz or 60 kHz. The long standard radio wave is made up of time information called a time code which is modulated by the AM modulation scheme and carried on a carrier wave of 40 kHz or 60 kHz. The received long standard wave is amplified by an amplifier 133 and filtered and synchronized by the filter portion 131 having a plurality of piezoelectric vibrators 30.

In the present embodiment, the piezoelectric vibrators 30 include quartz vibrator portions 138 and 139 having resonance frequencies at 40 kHz and 60 kHz which are the same as the carrier frequency.

Furthermore, the filtered signal at the predetermined frequency is detected and demodulated by a detection and rectification circuit 134. Subsequently, the time code is extracted by a waveform shaping circuit 135 and counted by the CPU 136. The CPU 136 reads out information about the current year, the total number of days, a day of the week, and the time. The read information is reflected on the RTC 137 and the precise time information is displayed.

Because the carrier wave is 40 kHz or 60 kHz, a vibrator having the tuning-fork structure described above is suitable for the quartz vibrator portions 138 and 139.

Although the above description has been given to the example in Japan, the frequency of the long standard wave is different overseas. For example, a standard wave of 77.5 kHz is used in Germany. When the radio-controlled clock 130 operable as well overseas is incorporated into a portable device, the piezoelectric vibrator 30 set at the frequency different from the frequencies used in Japan is required.

According to the radio-controlled clock 130 of the present embodiment, since the radio-controlled clock includes the piezoelectric vibrator 30 described above, it is possible to achieve improvement in the reliability of the radio-controlled clock itself and high quality. In addition to this, it is possible to count the time highly accurately and stably over a long period of time.

It should be noted that the technical scope of the present invention is not limited to the embodiments above, and the present invention can be modified in various ways without departing from the spirit of the present invention.

For example, although the embodiment has been described by way of an example of a turning-fork type piezoelectric vibrating reed having the groove portions 5 as an example of the piezoelectric vibrating reed 1, the groove portions 5 may not be provided. The piezoelectric vibrating reed of the present invention is not limited to the turning-fork type piezoelectric vibrating reed but may be a thickness-shear type piezoelectric vibrating reed. In this case, it is also possible to suppress the vibration loss of the vibrating part that vibrates in a thickness shear mode and to thus obtain a high-quality thickness-shear type vibrating reed in which the influence of the vibration loss on the vibration characteristics is very small.

Moreover, although in the embodiment, the sloped surface 4c is formed such that the angle θ between the side surface of the mounting portion 4a and the sloped surface 4c is 45°, the slope angle θ is not limited to this value but can be freely designed to other values. However, the slope angle θ is preferably in the range of 30° and 60°.

What is claimed is:

1. A piezoelectric vibrating reed comprising:
   a vibrating section extensive in parallel in a longitudinal direction; and
   a base to which the vibrating section is connected at its proximal end, wherein the base comprises at least a first section and a second section defined along the longitudinal direction, the first section being closer to a proximal end of the base than the second section and wider in a transverse direction than the second section, and wherein the base further comprises oblique side surfaces connecting a side surface of the first section and a side surface of the second section on respective sides of the base.

2. The piezoelectric vibrating reed according to claim 1, wherein the oblique side surface is angled at between 30 and 60 degrees with respect to the longitudinal direction.

3. The piezoelectric vibrating reed according to claim 2, wherein the oblique side surface is angled at 45 degrees with respect to the longitudinal direction.

4. The piezoelectric vibrating reed according to claim 1, wherein the vibrating section comprises a pair of arms extensive in parallel in the longitudinal direction.

5. A piezoelectric vibrator comprising the piezoelectric vibrating reed according to claim 1.

6. The piezoelectric vibrator according to claim 5, comprising:
   a base substrate on which the piezoelectric vibrating reed is mount;
   a lid substrate bonded to the base substrate so that the piezoelectric vibrating reed is enclosed in a cavity formed in the bonded base and lid substrates; and outer electrodes formed in a lower surface of the base substrate for supply electricity to vibrate the piezoelectric vibrating reed.

7. The piezoelectric vibrator according to claim 5, comprising:
 a casing that encloses the piezoelectric vibrating reed inside thereof;
 an annular stem fixed to the casing;
 two lead terminals extensive through the stem, the lead terminals having inner leads electrically connected to the piezoelectric vibrating reed, and outer leads extensive on the opposite side of the inner leads; and
 a filler that fills the step to fix the lead terminals.

8. An oscillator comprising the piezoelectric vibrator according to claim 5, which is connected to an integrated circuit of the oscillator.

9. An electronic device comprising:
 a clock; and
 the piezoelectric vibrator according to claim 5 electrically connected to the clock.

10. A radio-controlled clock comprising:
 a filter; and
 the piezoelectric vibrator according to claim 5 electrically connected to the filter.

* * * * *